United States Patent
Nakamura (10) Patent No.: US 9,949,363 B2
(45) Date of Patent: Apr. 17, 2018

(54) CIRCUIT ASSEMBLY (71) Applicant: Sumitomo Wiring Systems, Ltd., Yokkaichi, Mie (JP)

(72) Inventor: Arinobu Nakamura, Mie (JP)

(73) Assignee: Sumitomo Wiring Systems, Ltd., Yokkaichi, Mie (JP)

( * ) Notice: Subject to any disclaimer, the term of this patent is extended or adjusted under 35 U.S.C. 154(b) by 16 days.

(21) Appl. No.: 15/024,391

(22) PCT Filed: Sep. 3, 2014

(86) PCT No.: PCT/JP2014/073241
§ 371 (c)(1),
(2) Date: Mar. 24, 2016

(87) PCT Pub. No.: WO2015/045767
PCT Pub. Date: Apr. 2, 2015

(65) Prior Publication Data
US 2016/0234928 A1     Aug. 11, 2016

(30) Foreign Application Priority Data
Sep. 24, 2013   (JP) ................................ 2013-196764

(51) Int. Cl.
*H05K 1/02*     (2006.01)
*B60R 16/023*   (2006.01)
(Continued)

(52) U.S. Cl.
CPC ....... *H05K 1/0263* (2013.01); *B60R 16/0238* (2013.01); *B60R 16/0239* (2013.01);
(Continued)

(58) Field of Classification Search
CPC ............... H05K 1/0263; H05K 3/4084; H05K 2201/10272; H05K 2201/1028
(Continued)

(56) References Cited

U.S. PATENT DOCUMENTS 3,155,767 A *  11/1964  Schellack ............ H05K 3/4084
                                                174/260
6,290,552 B1   9/2001   Saito et al.
6,444,911 B2 *  9/2002  Maruyama ............... H02G 3/16
                                                174/70 B
7,108,519 B2 *  9/2006  Tomikawa ......... H01R 13/6658
                                                439/76.2
(Continued)

FOREIGN PATENT DOCUMENTS

JP    2000-333343 A    11/2000
JP    2001-275230 A    10/2001
(Continued)

*Primary Examiner* — Mukund G Patel
(74) *Attorney, Agent, or Firm* — Dinsmore & Shohl LLP (57) ABSTRACT Provided is a circuit assembly having a new structure in which a busbar circuit unit overlapped with a printed circuit board can reliably be fixed regardless of the heating temperature during soldering of an electrical component. In a circuit assembly in which a busbar circuit unit is overlapped with and fixed to a printed circuit board, the busbar circuit unit is configured as one piece by busbars being buried between insulator layers, and a section of the busbars is exposed via a through-hole of the insulator layer. The insulator layer of the busbar circuit unit is overlapped with the printed circuit board and is fixed thereto via fixing means, and terminal sections of an electrical component are soldered to and mounted on the exposed section of the busbar circuit unit and a printed wiring of the printed circuit board.

10 Claims, 8 Drawing Sheets (51) Int. Cl.
   *H05K 1/18*    (2006.01)
   *H05K 3/00*    (2006.01)
   *H05K 3/34*    (2006.01)

(52) U.S. Cl.
   CPC .............. *H05K 1/021* (2013.01); *H05K 1/181* (2013.01); *H05K 3/341* (2013.01); *H05K 3/0061* (2013.01); *H05K 3/3421* (2013.01); *H05K 2201/09063* (2013.01); *H05K 2201/10166* (2013.01); *H05K 2201/10272* (2013.01); *Y02P 70/611* (2015.11)

(58) Field of Classification Search
   USPC .................. 361/772–775; 439/76.2; 174/260
   See application file for complete search history.

(56) References Cited

U.S. PATENT DOCUMENTS

| | | | |
|---|---|---|---|
| 7,167,377 B2* | 1/2007 | Onizuka | H05K 1/0263 361/772 |
| 7,632,110 B2* | 12/2009 | Kanou | B60R 16/0239 361/704 |
| 2001/0025718 A1 | 10/2001 | Maruyama et al. | |
| 2005/0239345 A1* | 10/2005 | Furuno | H01R 12/585 439/751 |

FOREIGN PATENT DOCUMENTS

| | | | |
|---|---|---|---|
| JP | 2001-352642 A | 12/2001 | |
| JP | 2003-164039 A | 6/2003 | |
| JP | 2006-005096 A | 1/2006 | |
| JP | 2007-306672 A | 11/2007 | |

* cited by examiner

CIRCUIT ASSEMBLY

CROSS-REFERENCE TO RELATED APPLICATIONS

This application is the U.S. national stage of PCT/JP2014/073241 filed Sep. 3, 2014, which claims priority of Japanese Patent Application No. JP2013-196764 filed Sep. 24, 2013.

FIELD OF THE INVENTION

The present invention relates to a circuit assembly in which a busbar circuit unit constituted by a plurality of busbars is overlapped with and fixed to a printed circuit board.

BACKGROUND OF THE INVENTION

Conventionally, circuit assemblies that include a composite arrangement of a printed circuit board serving as a control circuit and a busbar circuit unit that is constituted by a plurality of busbars and serves as a large current circuit are known as a circuit assembly that is to be accommodated in an electrical junction box of an automobile. Particularly in recent years, a circuit assembly, as disclosed in JP 2003-164039A, that has a structure in which busbars constituting a busbar circuit unit are directly fixed to a surface of a printed circuit board via an adhesive layer has been proposed, in order to achieve downsizing and space-saving of the electrical junction box.

Terminal sections of electrical components such as a relay and a switch are connected to and mounted on printed wirings of the printed circuit board and the busbars of the busbar circuit unit of such a circuit assembly by soldering such as reflow soldering.

However, the circuit assembly having the conventional structure has the problem that in the process of mounting the electrical components by soldering, adhesion between the busbars and the printed circuit board with the adhesive layer cannot be maintained. Specifically, in recent soldering processes using lead-free solder, the heating temperature in the reflow furnace at the time of soldering needs to be higher than that in the case of conventional eutectic soldering, and may be higher than the melting temperature of plated layers such as tin plating applied to the surface of the busbars. In this case, there is the risk that due to the melting of the plated layer, the adhesion between the adhesive layer and the busbars is not maintained and the busbars are removed or separated from the printed circuit board.

Meanwhile, JP 2007-306672A proposes that plated layers of busbars are made of nickel that has the melting temperature higher than the heating temperature of a reflow furnace. Although this measure indeed solves the problem that the plated layers of the busbars are melted due to the heating temperature at the time of soldering and the adhesion between the plated layers and the adhesive layer is damaged, the nickel-plated terminal sections of the busbars inevitably have a high hardness. Accordingly, if a plated layer of a counterpart terminal that is connected to the nickel-plated terminal section is plated with, for example, tin, which has a lower hardness than nickel, there will be the risk that a new problem may be caused that due to sliding of the contact surfaces of both terminals with respect to each other, the plated layer having a lower hardness wears and the contact resistance increases.

SUMMARY OF INVENTION

The present invention was made in view of the above-described circumstances, and its object to be solved is to provide a circuit assembly that has a new structure in which a busbar circuit unit that is overlapped with a printed circuit board can reliably be fixed thereto regardless of the heating temperature at the time of soldering of an electrical component.

According to a first aspect of the present invention, a circuit assembly is such that a busbar circuit unit that is constituted by a plurality of busbars is overlapped with and fixed to a printed circuit board that has a printed wiring, wherein the busbar circuit unit is configured as one piece by the busbars being buried in an insulator layer, and has an exposed section in which a part of the busbars is exposed via a through-hole formed in the insulator layer, the insulator layer of the busbar circuit unit is overlapped with the printed circuit board, and is fixed to the printed circuit board via fixing means, and terminal sections of an electrical component are soldered to and mounted on the exposed section of the busbar circuit unit and the printed wiring of the printed circuit board.

According to this aspect, the circuit assembly is configured in a state in which the busbars are buried in the insulator layer, and the insulator layer is overlapped with the printed circuit board and is fixed thereto via the fixing means. Accordingly, even if the circuit assembly is heated when an electrical component is mounted on the circuit assembly by soldering, and surface plating of the busbars is melted, the melting of the plating does not affect the fixation surface of the busbar circuit unit that is fixed to the printed circuit board, and the fixation state is reliably maintained.

Moreover, since the melting of the plating of the busbars does not affect the fixation strength between the busbar circuit unit and the printed circuit board, it is not necessary to change the type of the plating on the surfaces of the busbars depending on the heating temperature at the time of soldering, improving the degree of freedom of selection for plating of the busbars. For example, even if an electrical component is mounted on the circuit assembly by reflow soldering using lead-free solder, the busbars can be plated with tin, which has a lower melting temperature than the lead-free solder.

In addition, since the busbar circuit unit is configured as one piece by the busbars being buried in the insulator layer, handling and the insulation property of the busbar circuit unit are improved.

Note that any fixing means may be used as long as it can fix the insulator layer of the busbar circuit unit to the printed circuit board with relative positions fixed, and may be, for example, an adhesive sheet or an adhesive agent that is provided between the insulator layer and the printed circuit board, or may be configured by, for example, clinch sections or a bolt and a nut that sandwich the insulator layer and the printed circuit board.

Furthermore, the busbar circuit unit may be configured by molding an insulator layer made of a synthetic resin around the busbars, or the busbar circuit unit that has an insulator layer in which the busbars are buried may be configured by pressing a prepreg, which is a sheet material obtained by impregnating fiberglass cloth with a half-cured epoxy resin, against both sides of the busbars, and curing the prepreg by thermal pressing.

According to a second aspect of the present invention, the circuit assembly according to the first aspect is such that the busbar circuit unit has a terminal section that is formed as one piece with ends of the busbars and protrudes outward from the insulator layer, and a thickness of the terminal section is increased by folding over the ends of the busbars.

According to this aspect, the terminal section provided at the ends of the busbars has a large plate thickness by folding over the ends. Therefore, it is possible to reduce the plate thickness of the intermediate section, in the length direction, of the busbars constituting the circuit section while ensuring the plate thickness that is needed for the connector connection terminal section, making it possible to avoid the plate thickness of the circuit section of the busbars that is larger than necessary in conformity to the terminal section, achieving a reduction in material cost.

Furthermore, by reducing the thickness of the circuit sections that are to be buried in the insulator layer, it is possible to reduce the entire plate thickness of the insulator layer, and to advantageously achieve a reduction in material cost and reduction in size and thickness of the entire busbar circuit unit.

According to a third aspect of the present invention, the circuit assembly according to the first or second aspect is such that the fixing means is constituted by a clinch section that is provided at an end of the busbars protruding outward from an outer edge section of the insulator layer of the busbar circuit unit, and the insulator layer of the busbar circuit unit is fixed to the printed circuit board by the clinch section being bent toward the printed circuit board with which the insulator layer is overlapped and the printed circuit board being sandwiched between the insulator layer and the clinch section.

According to this aspect, by the clinch section provided at an end of the busbars serving as the fixing means and the printed circuit board being sandwiched between the insulator layer and the clinch section, it is possible to fix the busbar circuit unit to the printed circuit board. Therefore, an adhesive sheet that is conventionally needed for fixing a busbar circuit unit to a printed circuit board can be omitted, making it possible to reduce the number of components.

Additionally, since the fixation of the busbar circuit unit to the printed circuit board is made by the mechanical fixing means using the clinch section, it is possible to firmly and reliably maintain the fixation state of both components without being further affected by heating at the time of soldering.

According to a fourth aspect of the present invention, the circuit assembly according to any one of the first to third aspect is such that the fixing means is constituted by an adhesive sheet that is provided between the insulator layer of the busbar circuit unit and the printed circuit board.

According to this aspect, a wide range of the contact surface of the insulator layer of the busbar circuit unit to the printed circuit board can reliably be fixed to the printed circuit board via the adhesive sheet. Moreover, since the adhesive sheet is directly adhered to the insulator layer and is separated from the plated sections of the busbars, it is possible to eliminate the influence of melting of the plating of the busbars on the adhesion force, and to advantageously maintain the stable fixation state.

Note that either or both of the adhesive sheet and the clinch section may be employed as the fixing means.

According to a fifth aspect of the present invention, the circuit assembly according to any one of the first to fourth aspect is such that a heatsink made of a metal plate is directly fixed to a surface of the busbar circuit unit that is opposite to a surface overlapped with the printed circuit board.

According to this aspect, since the busbars of the busbar circuit unit are buried in the insulator layer, it is possible to directly fix the heatsink made of a metal plate to the busbar circuit unit. Therefore, an insulating member that is conventionally needed for mounting a heatsink on a busbar circuit unit can be omitted, making it possible to reduce the number of components, to simplify the structure, and to facilitate the manufacturing.

According to a sixth aspect of the present invention, the circuit assembly according to any one of the first to fifth aspect is such that a surface of the printed circuit board that is opposite to a mounting surface is overlapped with the busbar circuit unit, the printed circuit board has a through-hole at a position that corresponds to the exposed section of the busbar circuit unit, and a busbar is exposed on the mounting surface of the printed circuit board.

According to this aspect, an electrical component can easily be soldered to the printed wiring of the printed circuit board and the busbar of the busbar circuit unit by reflow soldering, achieving simplification of the manufacturing process. Moreover, removal of the printed circuit board from the busbar circuit unit due to a heating temperature in a reflow furnace is advantageously prevented.

According to the present invention, since the busbars are buried in the insulator layer, and the insulator layer is fixed to the printed circuit board, the fixation state can reliably be maintained even if surface plating of the busbars is melted at the time of soldering an electrical component. Therefore, it is not necessary to change the type of the plating on the surface of the busbars depending on the heating temperature at the time of soldering, improving the degree of freedom of selection for plating of the busbars. Moreover, since the busbar circuit unit is configured as one piece by the busbars being buried in the insulator layer, handling and the insulation property of the busbar circuit unit are improved.

DETAILED DESCRIPTION OF THE PREFERRED EMBODIMENTS

Hereinafter, embodiments of the present invention will be described with reference to the drawings.

Figure 1:
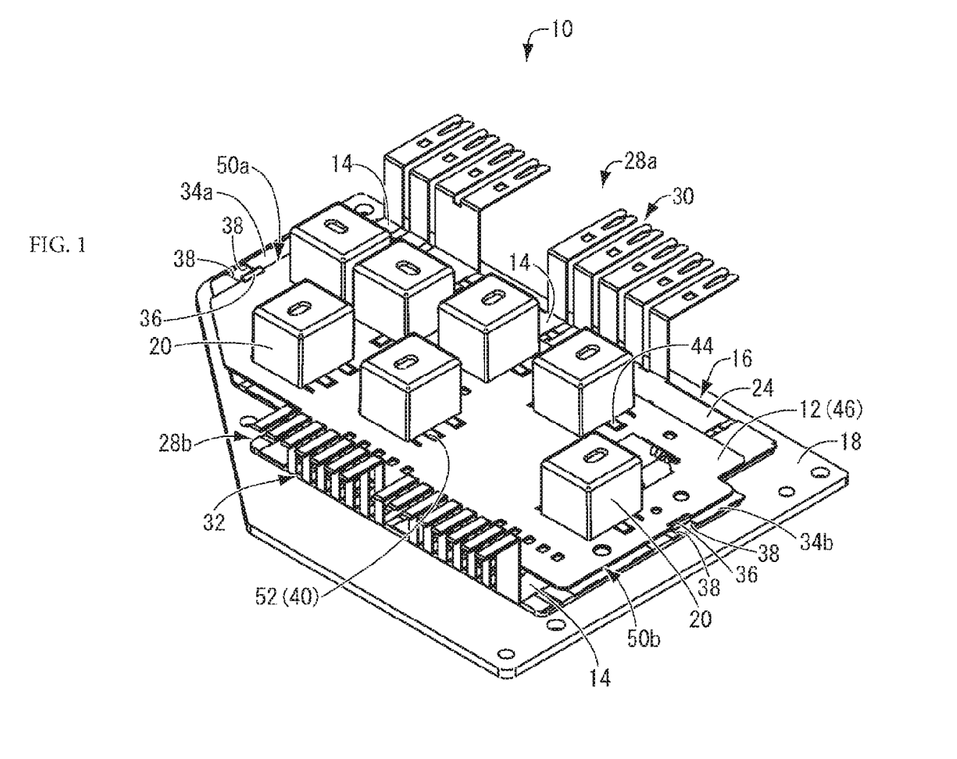
FIG. 1 is a perspective view illustrating a circuit assembly serving as an embodiment of the present invention.
Figure 2:
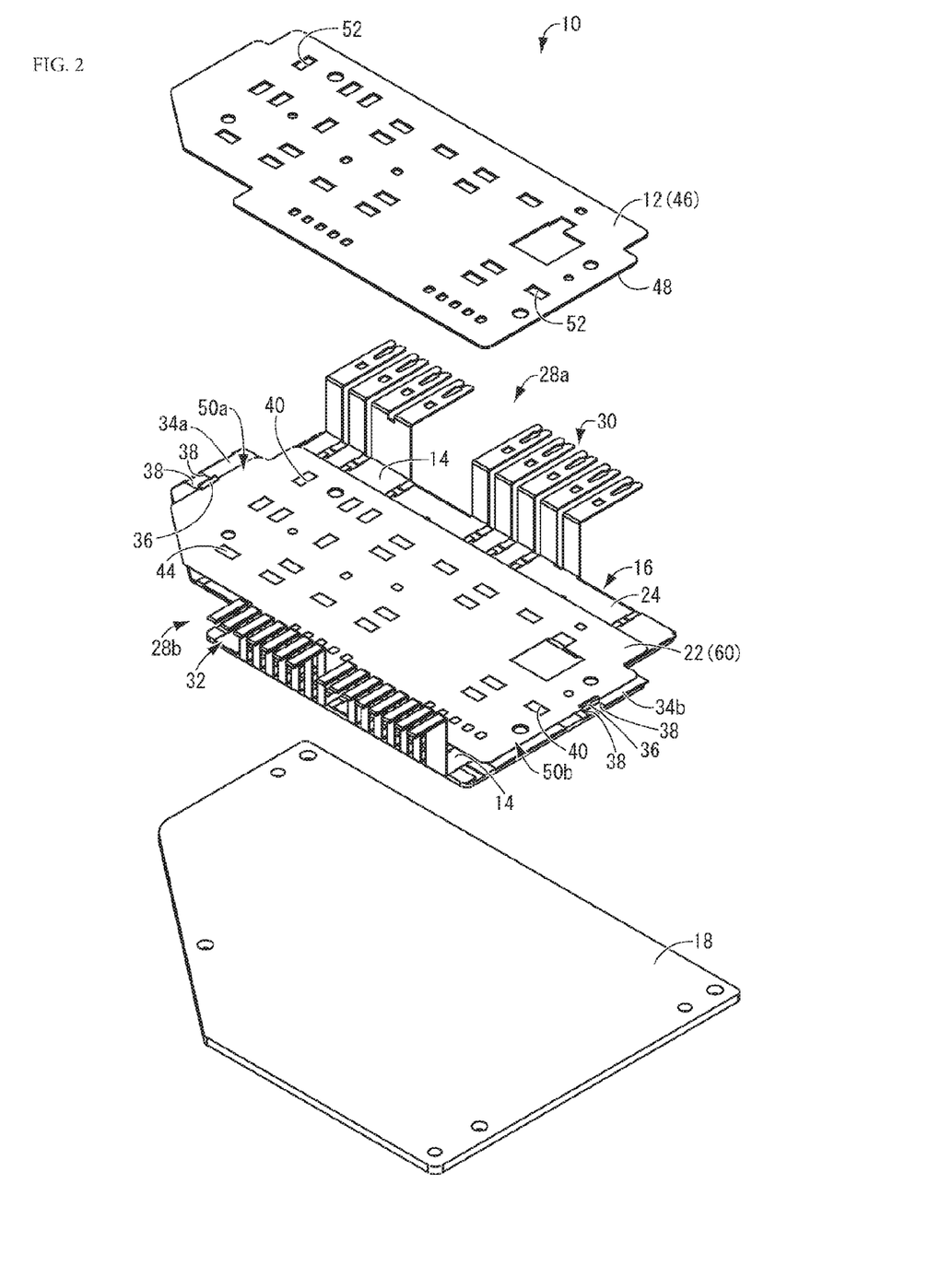
FIG. 2 is an exploded perspective view of the circuit assembly (not including an electrical component) that is shown in FIG. 1.

First, FIGS. 1 to 7 show a circuit assembly 10 serving as an embodiment of the present invention. As shown in FIGS. 1 and 2, the circuit assembly 10 includes a printed circuit board 12 having printed wirings that are not shown, a busbar circuit unit 16 that is constituted by a plurality of busbars 14, and a heatsink 18 that is made of a metal plate. The circuit assembly 10 is constituted by the printed circuit board 12 on which electrical components 20 such as relays are mounted being overlapped with and fixed to the upper side of the busbar circuit unit 16, and the heatsink 18 being directly fixed to the lower side of the busbar circuit unit 16. Note that in the following description, unless otherwise noted, "upper side" refers to the upper side of FIG. 1 on which the printed circuit board 12 is located, and "lower side" refers to the lower side of FIG. 1 on which the heatsink 18 is located.

Figure 3:
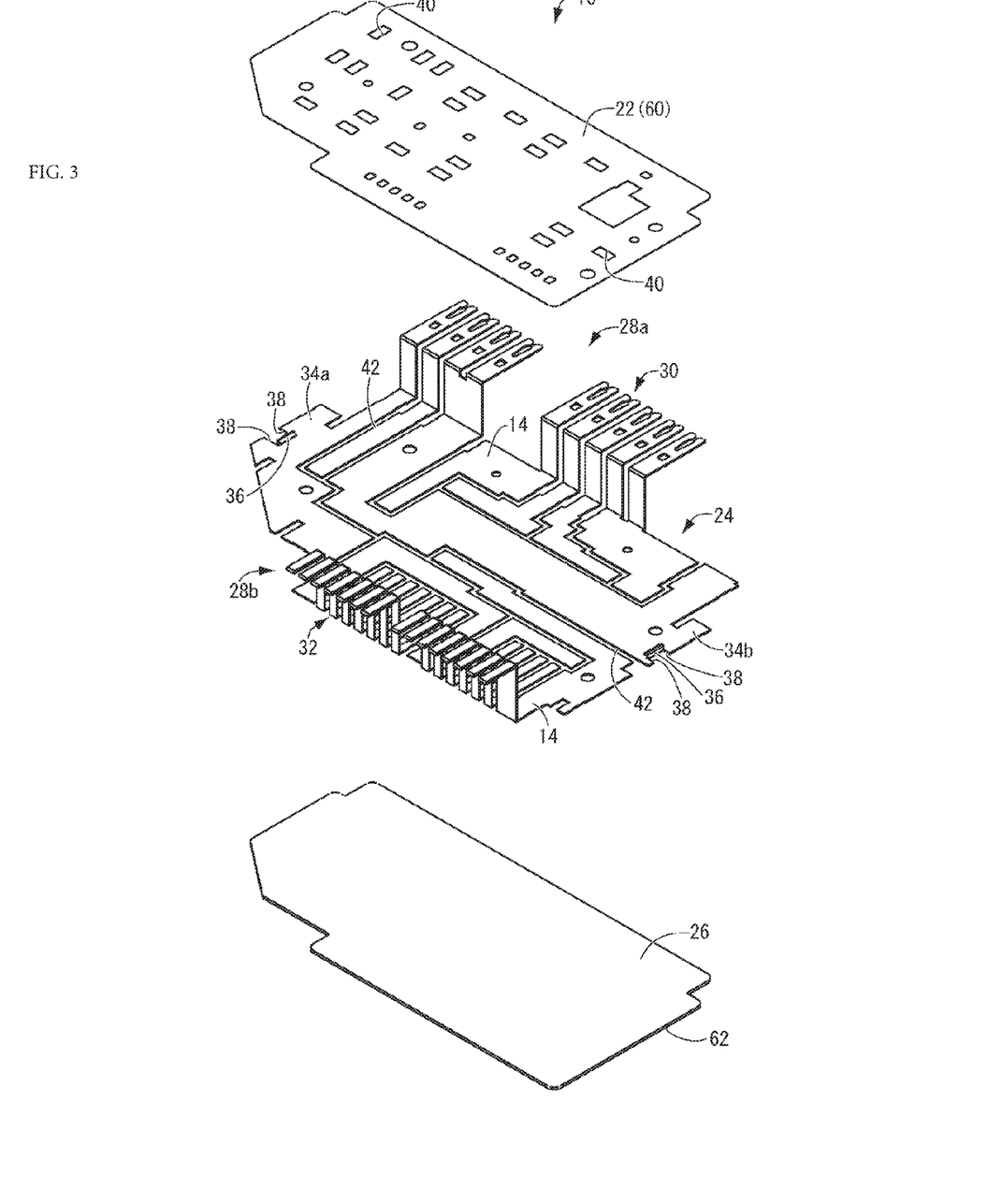
FIG. 3 is an exploded perspective view of a busbar circuit unit shown in FIG. 2.
Figure 4:
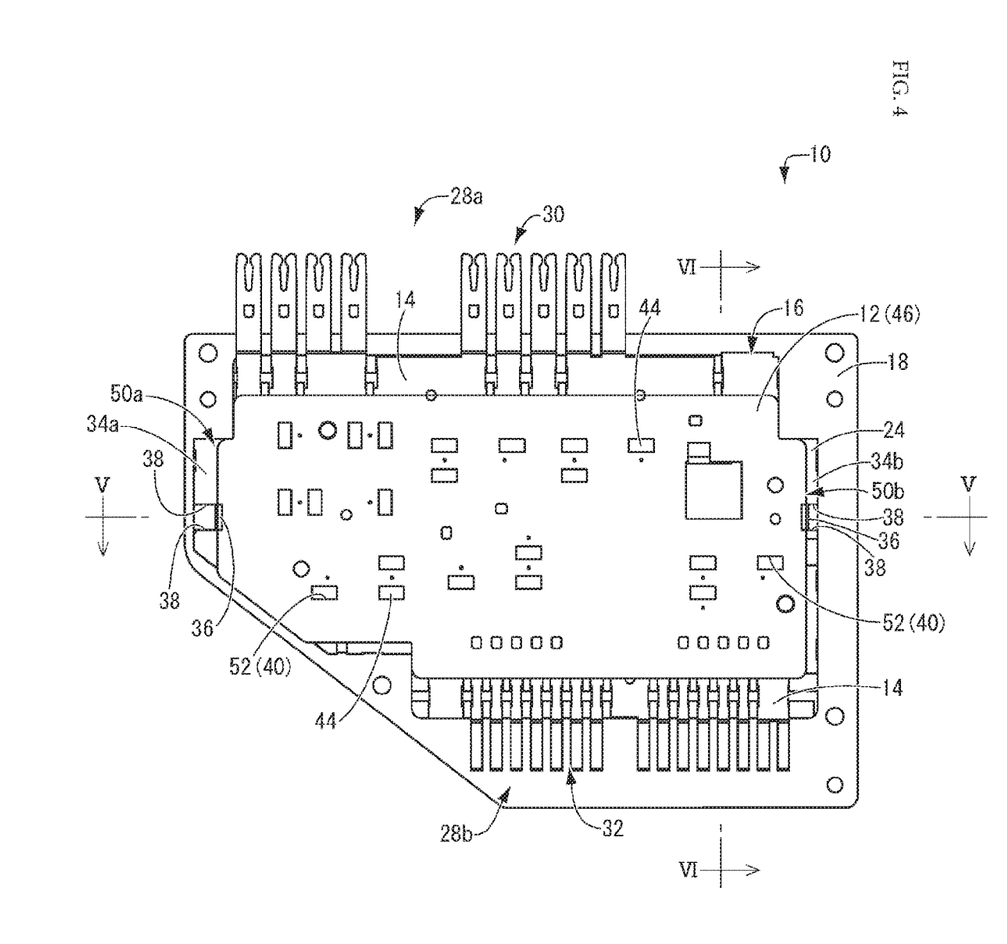
FIG. 4 is a plan view of the circuit assembly (not including an electrical component) that is shown in FIG. 1.

As shown in FIG. 3, the busbar circuit unit 16 includes an upper insulator layer 22, a busbar circuit 24 that is constituted by the plurality of busbars 14, and a lower insulator layer 26. The busbar circuit 24 is of a conventionally known type, and is formed by a conductive metal plate being pressed, punched, and bent. Specifically, the busbar circuit 24 has two ends 28a and 28b in its width direction, and at one end 28a (at the rear of FIG. 3), ends of the plurality of busbars 14 are bent in the shape of a crank and their tips are in the shape of a tuning fork so as to form a fuse connection terminal section 30. The connection sections of electrical components such as, for example, fuses that are not shown are configured to be inserted into the fuse connection terminal section 30 for connection. On the other hand, at the other end 28b (at the front of FIG. 3), ends of the plurality of busbars 14 are similarly bent in the shape of a crank, forming a connector connection terminal section 32. The connector connection terminal section 32 are configured to be inserted into, for example, a connector housing (not-shown) and serves as a connector terminal fitting.

In addition, a clinch section 36 is formed in substantially the center, in the width direction, of each of two ends 34a and 34b of the busbar circuit 24 in the longitudinal direction. Specifically, on each of the ends 34a and 34b in the longitudinal direction, a pair of slits 38 extending in the longitudinal direction from the edge section of that end are formed at a distance from each other in the width direction, which is orthogonal to the longitudinal direction, and so as to penetrate through the thickness of the busbar circuit 24. The clinch section 36 is formed by a rectangular region sandwiched in the width direction between the pair of slits 38 being cut and raised upwardly. Note that by the front ends of the clinch sections 36 being bent toward the printed circuit board 12 that is overlapped with the busbar circuit unit 16, the busbar circuit unit 16 is fixed to the printed circuit board 12, as will be described later.

On the other hand, as shown in FIGS. 2 and 3, both the upper insulator layer 22 and the lower insulator layer 26 are formed so as to be slightly smaller than the busbar circuit unit 16, and in particular, have a length in the longitudinal direction that is substantially the same as that of the distance between the clinch sections 36. As shown in FIG. 3, both the upper insulator layer 22 and the lower insulator layer 26 have substantially the same size, but the upper insulator layer 22 has a plurality of through-holes 40 that are used for mounting terminal sections 56 of the electrical components 20 that will be described later. Here, both the upper insulator layer 22 and the lower insulator layer 26 are made of a well-known insulating material commonly referenced as a prepreg, the prepreg may be obtained by fiberglass cloth being impregnated with an epoxy resin. In FIG. 3, the upper insulator layer 22 is in the so-called C-stage, in which a thermo-setting resin such as an epoxy resin is fully cured, but the lower insulator layer 26 is in the so-called B-stage, in which the thermo-setting resin is not fully cured. Thermal compression bonding is performed by placing the busbar circuit 24 between the upper insulator layer 22 and the lower insulator layer 26 that are in such stages and subjecting the busbar circuit 24 to heating and pressing. Accordingly, the thermo-setting resin of the lower insulator layer 26 that is not fully cured is melted to fill gaps 42 between the busbars 14 constituting the busbar circuit 24 (see FIGS. 3 and 5), and is fixed to the upper insulator layer 22, thereby serving as an integrated insulator layer. As a result, as shown in FIG. 2, the busbar circuit unit 16 is formed as one piece by the busbars 14 being buried between the integrated insulator layers 22 and 26, and exposed sections 44 in which parts of the upper surfaces of the busbars 14 are respectively exposed through the through-holes 40 formed on the upper insulator layer 22 are formed on the busbar circuit unit 16. Note that the lower insulator layer 26 is fully cured by being cooled after the thermal compression bond, and will not be melted even by being heated thereafter.

Figure 6:
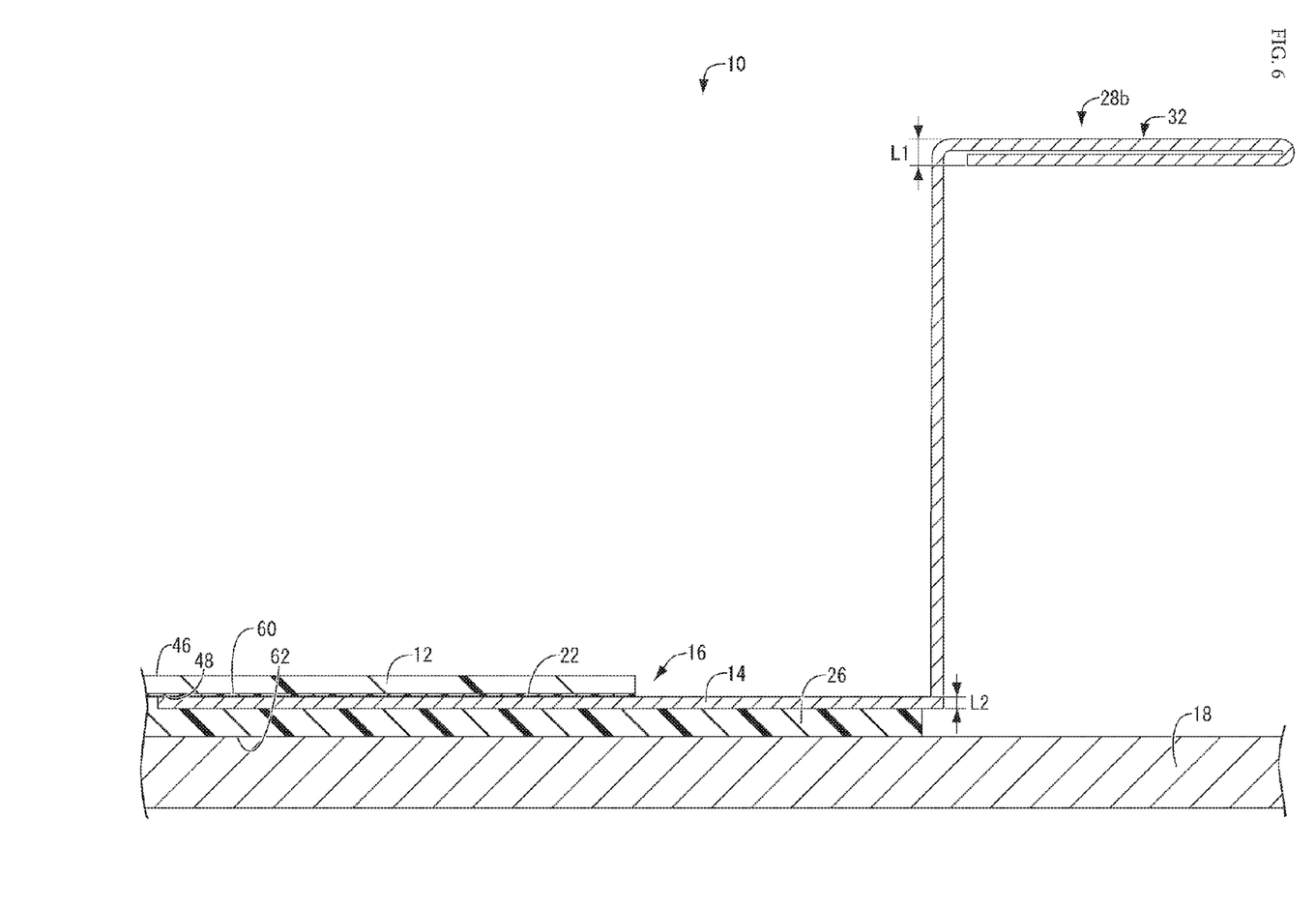
FIG. 6 is an enlarged view of a main part taken along the cross-section VI-VI of FIG. 4.

As shown in FIGS. 2 and 6, the busbar circuit unit 16 having such a configuration has, on the end 28b (at the front of FIG. 2) of the busbars 14, the connector connection terminal section 32 that is formed as one piece therewith and protrudes outward from the insulator layers 22 and 26, the connector connection terminal section 32 serving as a terminal section. Furthermore, as shown in FIG. 6, the end of the busbar 14 of the connector connection terminal section 32 is bent and folded over, and thereby the plate thickness of the connector connection terminal section 32 (L1) is substantially twice as large as the plate thickness of the busbar 14 (L2). Accordingly, it is possible to reduce the plate thickness (L2) of the intermediate section in the length direction of the busbars 14 constituting the circuit section while ensuring the plate thickness (L1) that is needed for the connector connection terminal section 32. Therefore, it is possible to avoid a plate thickness of the circuit section of the busbars 14 that is larger than necessary in conformity to the connector connection terminal section 32, achieving a reduction in material cost. Furthermore, since it is possible to reduce the thickness of the circuit sections of the busbars 14 that are buried between the insulator layers 22 and 26, making it also possible to reduce the entire thickness of the insulator layers 22 and 26 and to advantageously achieve a reduction in material cost and a reduction in size and thickness of the entire busbar circuit unit 16.

Then, as shown in FIGS. 1 and 2, the printed circuit board 12 is overlapped with and fixed to the busbar circuit unit 16 having such a configuration. Specifically, a surface 48 of the printed circuit board 12 that is opposite to a mounting surface 46 on which the electrical components 20 are to be mounted is overlapped with the busbar circuit unit 16, that is, the upper insulator layer 22 of the busbar circuit unit 16 is overlapped with the printed circuit board 12, and is fixed thereto via the clinch sections 36, which constitute fixing means.

Figure 5:
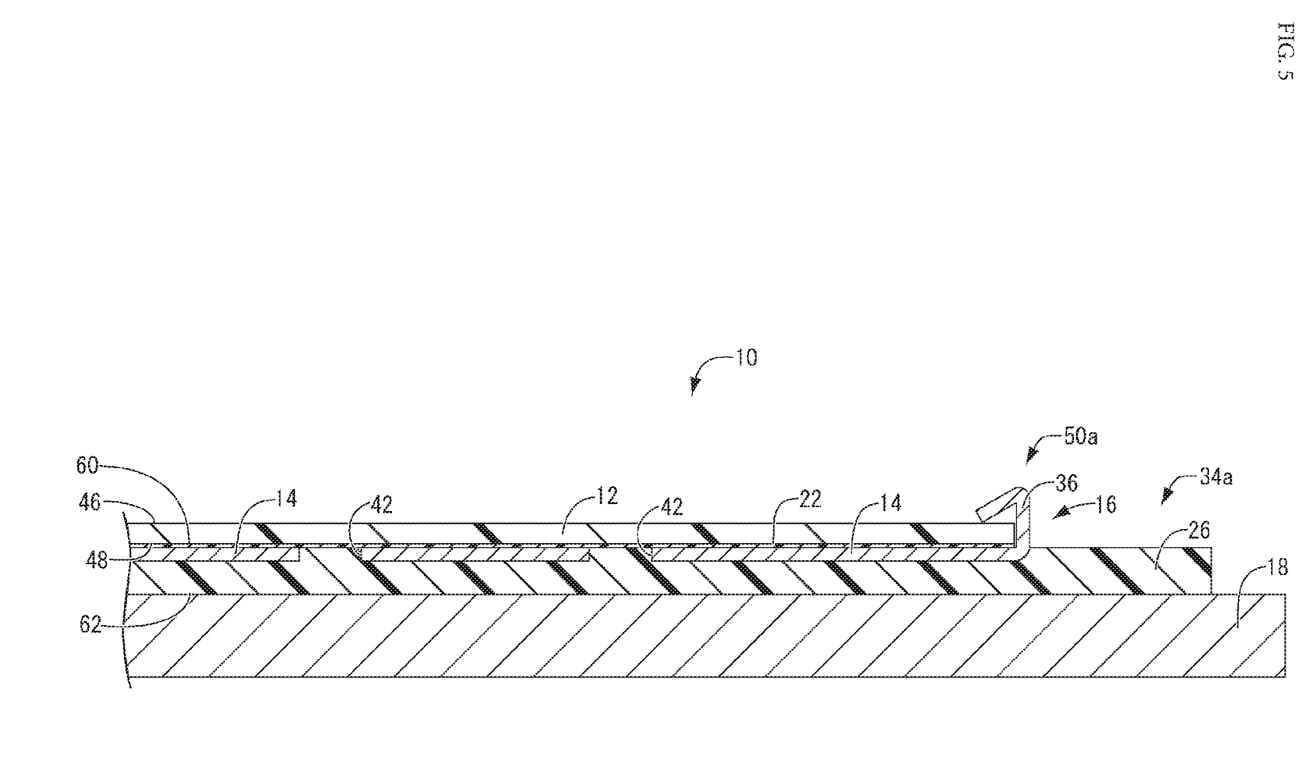
FIG. 5 is an enlarged view of a main part taken along the cross-section V-V of FIG. 4.

Here, the clinch sections 36 are provided, as shown in FIG. 2, at the ends 34a and 34b of the busbars 14 constituting the busbar circuit 24 of the busbar circuit unit 16 that extend outward from outer edge sections 50a and 50b of the insulator layers 22 and 26 in the longitudinal direction. As shown in FIG. 5, at the ends 34a and 34b of the busbars 14, the front ends of the above-described clinch sections 36 that are cut and raised upward are bent toward the printed circuit board 12, and the printed circuit board 12 is held between the upper insulator layer 22 and the front ends of the clinch sections 36, and thereby the upper insulator layer 22 of the busbar circuit unit 16 is fixed to the printed circuit board 12.

Therefore, an adhesive sheet that is conventionally needed for fixing a busbar circuit unit to a printed circuit board can be omitted, making it possible to reduce the number of components. Additionally, since the fixation of the busbar circuit unit 16 to the printed circuit board 12 is made by the mechanical fixing means using the clinch sections 36, it is possible to firmly and reliably maintain the fixation state of the busbar circuit unit 16 to the printed circuit board 12 without being further affected by heating at the time of soldering the electrical components 20 to the printed circuit board 12, which will be described later.

Figure 7:
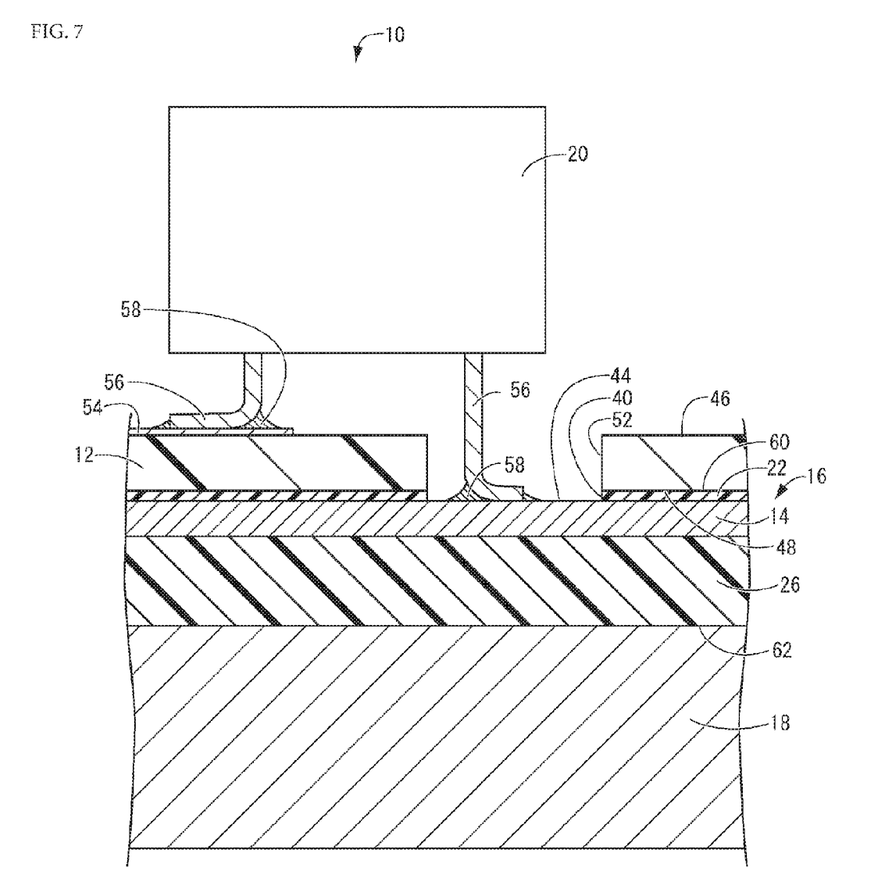
FIG. 7 is an enlarged cross-sectional view schematically illustrating a part of the circuit assembly shown in FIG. 1.

On the other hand, as shown in FIG. 2, the printed circuit board 12 has substantially the same shape as the upper insulator layer 22 constituting the busbar circuit unit 16, and has through-holes 52 at positions corresponding to the exposed sections 44 of the busbar circuit unit 16. Accordingly, parts of the upper surfaces of the busbars 14 are exposed along the mounting surface 46 of the printed circuit board 12. Accordingly, as shown in FIG. 7, in the circuit assembly 10 having such a configuration, the terminal sections 56 of the electrical component 20 can be mounted on the printed wiring 54 of the printed circuit board 12 and the exposed section 44 of the busbar circuit unit 16 by, for example, reflow soldering using lead-free solder 58 or the like. As described above, since the electrical components 20 can easily be soldered to the printed wiring 54 of the printed circuit board 12 and the busbar 14 of the busbar circuit unit 16 by reflow soldering, the manufacturing process can be simplified.

Here, a tie-bar cutting process for cutting a tie-bar (not shown) that temporarily bundles the plurality of busbars 14, and a bending process for bending the ends of the busbars 14 to form the fuse connection terminal section 30 and the connector connection terminal section 32 are performed after the reflow soldering in the present embodiment, but may be performed before the reflow soldering. Note that for ease of understanding, in all the figures, the busbars 14 are shown in the state of having completely subjected to the tie-bar cutting and the bending process.

Lastly, a heatsink 18 that is made of a metal plate and has a shape that is slightly larger than the flat part of the busbar circuit unit 16 is directly fixed to a lower surface 62 of the lower insulator layer 26 of the busbar circuit unit 16 that is opposite to the upper surface 60 of the upper insulator layer 22 that is overlapped with the printed circuit board 12, by a well-known thermally-conductive adhesive agent (not shown) such as an epoxy resin. In the present embodiment, since the busbars 14 are buried in the integrated insulator layers 22 and 26, it is possible to directly fix the heatsink 18 made of a metal plate to the busbar circuit unit 16. Therefore, an insulating member that is provided separately for mounting a heatsink to a busbar circuit unit can be omitted, making it possible to reduce the number of components, to simplify the structure, and to facilitate the manufacturing.

According to the circuit assembly 10 of the present embodiment that has such a configuration, the circuit assembly 10 is configured in a state in which the busbars 14 are buried in the integrated insulator layers 22 and 26, and the upper insulator layer 22 of the busbar circuit unit 16 is overlapped with the printed circuit board 12 and is fixed thereto via the clinch sections 36 configuring the fixing means. Accordingly, even if the circuit assembly 10 is heated when the electrical component 20 is mounted by soldering, and the solders on the surfaces of the busbars 14 are melted, the melting of the plating does not affect the upper insulator layer 22 serving as the fixation surface of the busbar circuit unit 16 that is fixed to the printed circuit board 12, and the fixation state is reliably maintained.

Therefore, it is not necessary to change the type of the plating on the surfaces of the busbars 14 depending on the heating temperature at the time of soldering, improving the degree of freedom of selection for plating of the busbars 14. For example, even if the electrical component 20 is mounted on the circuit assembly 10 by reflow soldering using the lead-free solder 58, the busbars 14 can be plated with tin, which has a lower melting temperature than the lead-free solder 58.

In addition, since the busbar circuit unit 16 is configured as one piece by the busbars 14 being buried between the integrated insulator layers 22 and 26, handling and the insulation property of the busbar circuit unit 16 are improved.

Figure 8:
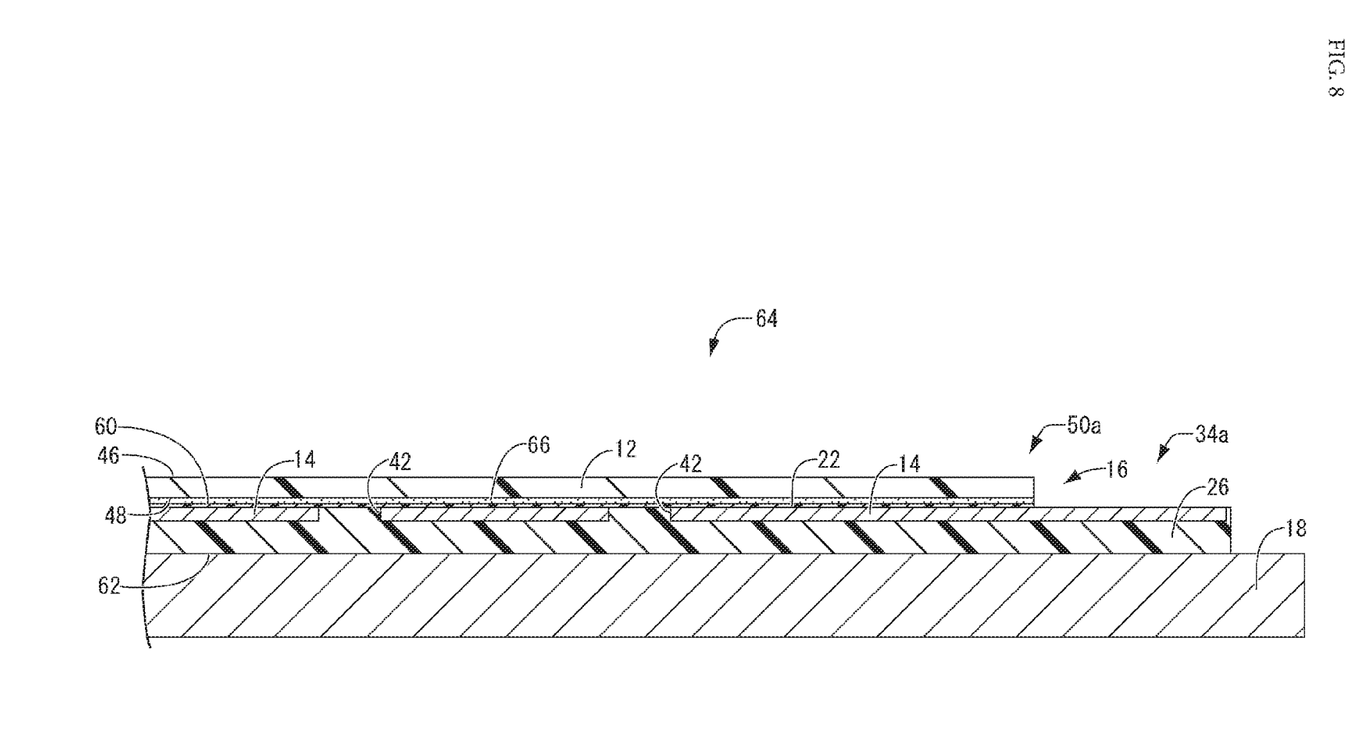
FIG. 8 is an enlarged cross-sectional view of a main part that corresponds to FIG. 5, illustrating another aspect of fixing means for use in the circuit assembly of the present invention.

Hereinafter, another aspect of the fixing means for use in the circuit assembly 10 of the present invention will be described in detail with reference to FIG. 8. The same reference numerals as those of the above-described embodiment are given to the same configurations in the figure as those of the above-described embodiment, and detailed descriptions thereof are omitted. In other words, a circuit assembly 64 indicates an embodiment different from the above-described embodiment in that the fixing means is configured by an adhesive sheet 66 that is provided between the upper insulator layer 22 of the busbar circuit unit 16 and the surface 48 of the printed circuit board 12 that is opposite to the mounting surface 46. Also in the circuit assembly 64, the upper insulator layer 22 of the busbar circuit unit 16 is fixed to the printed circuit board 12 by the adhesive sheet 66, and thus the circuit assembly 64 can have substantially the same configuration as that of the circuit assembly 10 of the above-described embodiment, making it possible to achieve the same effects.

Furthermore, a wide range of the contact surface of the upper insulator layer 22 of the busbar circuit unit 16 to the printed circuit board 12 can reliably be fixed to the surface 48 of the printed circuit board 12 that is opposite to the mounting surface 46 via the adhesive sheet 66. Moreover, since the adhesive sheet 66 is directly adhered to the upper insulator layer 22, and is separated from the plated section of the busbar 14, it is possible to eliminate the influence of melting of the plating on the surface of the busbar 14 on the adhesion force, and to advantageously maintain the stable fixation state.

Note that in this aspect, an example is shown in which instead of the clinch sections 36, the adhesive sheet 66 is employed as the fixing means, but it is also possible that both the clinch sections 36 and the adhesive sheet 66 are employed as the fixing means to achieve more reliable fixation between the printed circuit board 12 and the busbar circuit unit 16.

The embodiments of the present invention have been described in detail, but the present invention is not limited to the specific description. For example, any fixing means may be used as long as it can fix the upper insulator layer 22 of the busbar circuit unit 16 to the surface 48 of the printed circuit board 12 that is opposite to the mounting surface 46 at a fixed relative position, and may be, for example, an adhesive agent that is provided between the upper insulator layer 22 and the printed circuit board 12, or may be configured by, for example, a bolt and a nut that sandwich the upper insulator layer 22 and the printed circuit board 12.

Furthermore, the busbar circuit unit 16 may be configured by, in addition to the exemplified thermal compression bonding method in which the busbars 14 are sandwiched from the front and rear sides by the prepreg sheets, a method in which an insulator layer made of a synthetic resin is molded around the busbars 14 with the busbars 14 used as insert articles.

The invention claimed is:

1. A circuit assembly in which a busbar circuit unit that is constituted by a plurality of busbars is overlapped with and fixed to a printed circuit board that has a printed wiring, wherein the busbar circuit unit is configured as one piece by the busbars being buried in an insulator layer, the insulator layer having an upper insulator layer and a lower insulator layer, wherein the busbar circuit is sandwiched between the upper insulator layer and the lower insulator layer, and wherein the upper insulator has an exposed section in which a part of the busbars is exposed via a through-hole formed and the lower insulator layer is a continuous surface, and wherein the busbar circuit unit has a terminal section that is formed as one piece with ends of the busbars and protrudes outward from the insulator layer, and a thickness of the terminal section is increased by folding over the ends of the busbars;

the insulator layer of the busbar circuit unit is overlapped with the printed circuit board, and is fixed to the printed circuit board via fixing means, wherein the fixing means is constituted by a clinch section that is provided at an end of the busbars protruding outward from an outer edge section of the insulator layer of the busbar circuit unit, and the insulator layer of the busbar circuit unit is fixed to the printed circuit board by the clinch section being bent toward the printed circuit board with which the insulator layer is overlapped and the printed circuit board being sandwiched between the insulator layer and the clinch section, and terminal sections of an electrical component are soldered to and mounted on the exposed section of the busbar circuit unit and the printed wiring of the printed circuit board.

2. The circuit assembly according to claim 1, wherein the fixing means is constituted by an adhesive sheet that is provided between the insulator layer of the busbar circuit unit and the printed circuit board.

3. The circuit assembly according to claim 1, wherein a heatsink made of a metal plate is directly fixed to a surface of the busbar circuit unit that is opposite to a surface overlapped with the printed circuit board.

4. The circuit assembly according to claim 1, wherein a surface of the printed circuit board that is opposite to a mounting surface is overlapped with the busbar circuit unit, the printed circuit board has a through-hole at a position that corresponds to the exposed section of the busbar circuit unit, and a busbar is exposed on the mounting surface of the printed circuit board.

5. The circuit assembly according to claim 1, wherein the fixing means is constituted by a clinch section that is provided at an end of the busbars protruding outward from an outer edge section of the insulator layer of the busbar circuit unit, and the insulator layer of the busbar circuit unit is fixed to the printed circuit board by the clinch section being bent toward the printed circuit board with which the insulator layer is overlapped and the printed circuit board being sandwiched.

6. The circuit assembly according to claim 5, wherein the fixing means is constituted by an adhesive sheet that is provided between the insulator layer of the busbar circuit unit and the printed circuit board.

7. The circuit assembly according to claim 6, wherein a heatsink made of a metal plate is directly fixed to a surface of the busbar circuit unit that is opposite to a surface overlapped with the printed circuit board.

8. The circuit assembly according to claim 7, wherein a surface of the printed circuit board that is opposite to a mounting surface is overlapped with the busbar circuit unit, the printed circuit board has a through-hole at a position that corresponds to the exposed section of the busbar circuit unit, and a busbar is exposed on the mounting surface of the printed circuit board.

9. The circuit assembly according to claim 1, wherein the insulator layer of the busbar circuit unit has a surface area larger than a surface area of the printed circuit board.

10. The circuit assembly according to claim 6, wherein a heatsink made of a metal plate is directly fixed to the lower insulator layer and directly fixed to the busbar circuit unit.

* * * * *